US008428907B2

(12) United States Patent
Sakamoto

(10) Patent No.: US 8,428,907 B2
(45) Date of Patent: Apr. 23, 2013

(54) JITTER CALCULATING DEVICE, JITTER CALCULATING METHOD AND JITTER CALCULATING PROGRAM

(75) Inventor: Akihiro Sakamoto, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 290 days.

(21) Appl. No.: 12/847,692

(22) Filed: Jul. 30, 2010

(65) Prior Publication Data

US 2011/0035169 A1 Feb. 10, 2011

(30) Foreign Application Priority Data

Aug. 5, 2009 (JP) ................................. 2009-182249

(51) Int. Cl.
*G06F 11/30* (2006.01)
*G06F 11/00* (2006.01)
*G01R 23/175* (2006.01)

(52) U.S. Cl.
USPC ......................... 702/182; 714/799; 324/76.54

(58) Field of Classification Search .................. 702/182, 702/57–60, 66–67, 69–71, 79, 81, 84–85, 702/89, 108, 110, 117, 120, 123–125, 127, 702/183, 185, 189; 714/669, 707, 724, 731, 714/744, 798–799, 814; 716/100–101, 106, 716/108, 113, 132–134, 136; 700/108–110; 375/224, 226, 362, 371; 327/100, 165–166, 327/261, 263, 291–293, 299; 324/76.11, 324/76.39, 76.54
See application file for complete search history.

(56) References Cited

U.S. PATENT DOCUMENTS 7,295,938 B2 11/2007 Nakashiba et al.
2006/0220751 A1 10/2006 Nakashiba et al.

FOREIGN PATENT DOCUMENTS

| JP | 10-199990 | 7/1998 |
| JP | 2000-305966 | 11/2000 |
| JP | 2006-277557 | 10/2006 |

OTHER PUBLICATIONS

Sato et al., A Time-Slicing Ring Oscillator for Capturing Instantaneous Delay Degradation and Power Supply Voltage Drop, 2006 IEEE, IEEE 2006 Custom Integrated Circuits Conference (CICC), pp. 563-566.*
Notification of Reasons for Refusal mailed Jan. 28, 2013 by the Japan Patent Office in Japanese Patent Application No. 2009-182249 with English translation of the portions within the wavy lines, 6 pages.

\* cited by examiner

*Primary Examiner* — Toan Le
(74) *Attorney, Agent, or Firm* — Young & Thompson

(57) ABSTRACT

A path of a signal extends from an initial point through first and second cells to an end point. The signal is supplied as a first signal to the first cell and outputted therefrom as a second signal. The signal is supplied as a third signal to the second cell and outputted therefrom as a fourth signal. First delay amounts of the signal in the first cell and a transition time of the second signal are calculated based on a transition time of the first signal and a voltage supplied to the first cell. Second delay amounts of the signal in the second cell and a transition time of the fourth signal are calculated similarly. Here, the transition time of the second signal is set to be a transition time of the third signal. Jitter values in the end point are calculated based on the first and second amounts.

9 Claims, 10 Drawing Sheets

Fig. 4

DELAY TABLE

| INPUT TRANSITION TIME | SUPPLY VOLTAGE | CELL DELAY TIME | OUTPUT TRANSITION TIME |
|---|---|---|---|
| 1.0ns | 1.2V | 1.0ps | 1.0ns |
| 1.0ns | 1.1V | 1.1ps | 1.3ns |
| 1.0ns | 1.0V | 1.2ps | 1.6ns |
| ⋮ | ⋮ | ⋮ | ⋮ |
| 1.3ns | 1.2V | 1.1ps | 1.3ns |
| 1.3ns | 1.1V | 1.2ps | 1.6ns |
| 1.3ns | 1.0V | 1.3ps | 1.9ns |
| ⋮ | ⋮ | ⋮ | ⋮ |
| 1.3ns | 1.2V | 1.2ps | 1.6ns |
| 1.3ns | 1.1V | 1.3ps | 1.9ns |
| 1.3ns | 1.0V | 1.4ps | 2.2ns |
| ⋮ | ⋮ | ⋮ | ⋮ |
| 1.9ns | 1.2V | 1.3ps | 1.9ns |
| 1.9ns | 1.1V | 1.4ps | 2.2ns |
| 1.9ns | 1.0V | 1.5ps | 2.5ns |
| ⋮ | ⋮ | ⋮ | ⋮ |

Fig. 7

|  | BUF1 | BUF2 | BUF3 | BUF4 |
|---|---|---|---|---|
| INPUT TRANSITION TIME | 1.0ns | 1.0ns | 1.3ns | 1.9ns |
| SUPPLY VOLTAGE | 1.2V | 1.1V | 1.0V | 1.2V |
| CELL DELAY TIME | 1.0ps | 1.1ps | 1.3ps | 1.3ps |
| OUTPUT TRANSITION TIME | 1.0ns | 1.3ns | 1.9ns | 1.9ns |

Fig. 8

|  | BUF1 | BUF2 | BUF3 | BUF4 |
|---|---|---|---|---|
| SUPPLY VOLTAGE | 1.2V | 1.1V | 1.0V | 1.2V |
| CELL DELAY TIME | 1.1ps | 1.1ps | 1.2ps | 1.0ps |

JITTER CALCULATING DEVICE, JITTER CALCULATING METHOD AND JITTER CALCULATING PROGRAM

INCORPORATION BY REFERENCE

This application is based upon and claims the benefit of priority from Japanese patent application No. 2009-182249, filed on Aug. 5, 2009, the disclosure of which is incorporated herein in its entirety by reference.

BACKGROUND OF THE INVENTION

1. Field of the Invention

The present invention relates to a jitter calculating device, a jitter calculating method and a jitter calculating program.

2. Description of Related Art

In recent years, with respect to a semiconductor circuit, a layout design becomes finer, operation speed of the circuit becomes higher and a supply voltage becomes lower. Consequently, a margin is reduced in a timing verification. As a timing constraint becomes more severe, a design is required to be carried out at a higher precision. In particular, due to a voltage drop in a power source Wiring, delays and variations in circuit operations become large. For this reason, a risk of malfunction is elevated due to a fluctuation of a clock signal, which is referred to as a clock jitter. Thus, the magnitude of the clock jitter is desired to be estimated at a high precision.

In designing a semiconductor integrated circuit, a design target circuit is represented by a plurality of cells. Each of the plurality of cells indicates a predetermined element. In estimating a clock jitter, a path as an analysis target is set at first. The set path is a path extending from a clock supply source to a clock supply destination.

The path may include a plurality of cells. That is, a clock signal may be supplied through the plurality of cells to the clock supply destination. A propagation time (delay time) of the clock signal depends on magnitudes of power supply voltages (hereinafter, referred to as supply voltages) which are respectively supplied to the plurality of cells. The supply voltages to the respective cells may change with time. Accordingly, the delay time may change with time due to the changes in the supply voltages. Hence, it is considered to estimate the clock jitter based on magnitudes of changes in the supply voltages.

As related art, Japanese Patent Publication (JP-P2006-277557A) discloses a clock jitter calculating device. The clock jitter calculating device contains: supply voltage analyzing means for calculating changes in power source supply voltages to respective cells included in a propagation route of a clock signal in a predetermined time interval; delay time change calculating means for calculating changes in delay times for the above respective cells, which correspond to the above changes in the supply voltages; and jitter calculating means for calculating a magnitude of a jitter of a clock signal transmitted through the propagation route based on the above changes in delay times.

Also, as another related art, Japanese Patent Publication (JP-P2000-305966A) discloses a delay information generating (system. Japanese Patent Publication (JP-P2000-305966A) discloses that cell delays in all paths of other input cells are obtained by using an effective load capability and a rise or fall time of input waveform as keys.

By the way, the magnitude of the clock jitter does not depend on only the change in the supply voltage. The delay time in each cell also depends on a transition time of a clock signal (input signal) supplied to the cell. Also, a clock signal (output signal) outputted by each cell is supplied as an input signal to a cell arranged in a lower stage of the cell. Here, in each cell, the transition time of the output signal depends on the transition time of the input signal. Thus, the transition time of the clock signal successively changes at every passing a cell. Hence, the degrees of the influences of the transition times of the input signals on the delay times in the respective cells successively change.

Also, the transition time of the clock signal (output signal) outputted by each cell is also based on the magnitude of the supply voltage to the cell.

The present inventor has recognized as follows. In Japanese Patent. Publication (JP-P2006-277557A) and Japanese Patent Publication (JP-P2000-305966A), it is not considered that the delay time in each cell depends on the waveform of the input signal. Furthermore, it is not considered that the transition time of the output signal from each cell depends on the supply voltage. Therefore, there is a problem that a jitter cannot be estimated accurately by the method disclosed in Japanese Patent Publication (JP-P2006-277557A) or Japanese Patent Publication (JP-P2000-305966A).

SUMMARY

In one embodiment, a jitter calculating method includes: a step of obtaining a circuit data indicating a circuit; a step of setting a path of a signal, which extends from an initial point through a plurality of cells to an endpoint, to be an analysis target path based on the circuit data; a step of calculating power supply voltages respectively supplied to the plurality of cells as supply voltages based on the circuit data; a step of generating a cell delay data by calculating cell delay amounts indicating how long delay times of the signal are in each of the plurality of cells; and a step of calculating jitter values in the end point based on the cell delay data. The plurality of cells include an upper stage cell and a lower stage cell connected to a lower stage of the upper stage cell. The supply voltages include a first supply voltage supplied to the upper stage cell and a second supply voltage supplied to the lower stage cell. The signal is supplied as a first input signal to the upper stage cell. The signal is outputted as a first output signal from the upper stage cell. The signal is supplied as a second input signal to the lower stage cell. The signal is outputted as a second output signal from the lower stage cell. The step of generating the cell delay data includes: a step of calculating, based on a first input transition time as a transition time of the first input signal and the first supply voltage, first cell delay amounts indicating delay times of the signal in the upper stage cell and a first output transition time as a transition time of the first output signal; a step of setting the first output transition time to be a second input transition time as a transition time of the second input signal; and a step of calculating, based on the second input transition time and the second supply voltage, second cell delay amounts indicating delay times of the signal in the lower stage cell and a second output transition time as a transition time of the second output signal.

In another embodiment, there is provided a computer-readable recording medium as a non-transitory tangible medium, storing a jitter calculating program for causing a computer to perform the above jitter calculating method.

In another embodiment, a jitter calculating device includes: a circuit data obtaining unit configured to obtain a circuit data indicating a circuit; a path setting unit configured to set a path of a signal, which extends from an initial point through a plurality of cells to an end point, to be an analysis target path based on the circuit data; a supply voltage calculating unit configured to calculate power supply voltages respectively supplied to the plurality of cells as supply voltages based on the circuit data; a cell delay data generating unit configured to generate a cell delay data by calculating cell delay amounts indicating how long delay times of the signal are in each of the plurality of cells; and a jitter data generating unit configured to calculate jitter values in the end point based on the cell delay data. The plurality of cells include an upper stage cell and a lower stage cell connected to a lower stage of the upper stage cell. The supply voltages include a first supply voltage supplied to the upper stage cell and a second supply voltage supplied to the lower stage cell. The signal is supplied as a first input signal to the upper stage cell. The signal is outputted as a first output signal from the upper stage cell. The signal is supplied as a second input signal to the lower stage cell. The signal is outputted as a second output signal from the lower stage cell. The cell delay data generating unit calculates, based on a first input transition time as a transition time of the first input signal and the first supply voltage, first cell delay amounts indicating delay times of the signal in the upper stage cell and a first output transition time as a transition time of the first output signal. The cell delay data generating unit sets the first output transition time to be a second input transition time as a transition time of the second input signal. The cell delay data generating unit calculates, based on the second input transition time and the second supply voltage, second cell delay amounts indicating delay times of the signal in the lower stage cell and a second output transition time as a transition time of the second output signal.

According to the jitter calculating method the jitter calculating device and the computer-readable recording medium, a jitter can be estimated accurately.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 4 is a conceptual diagram showing a delay table;

FIG. 7 is an explanatory drawing illustrating an operation of a cell delay data generating unit;

FIG. 8 is a conceptual drawing showing cell delay times obtained in a comparison example;

DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Embodiments of the present invention will be described below with reference to the drawings.

First Embodiment

Figure 1:
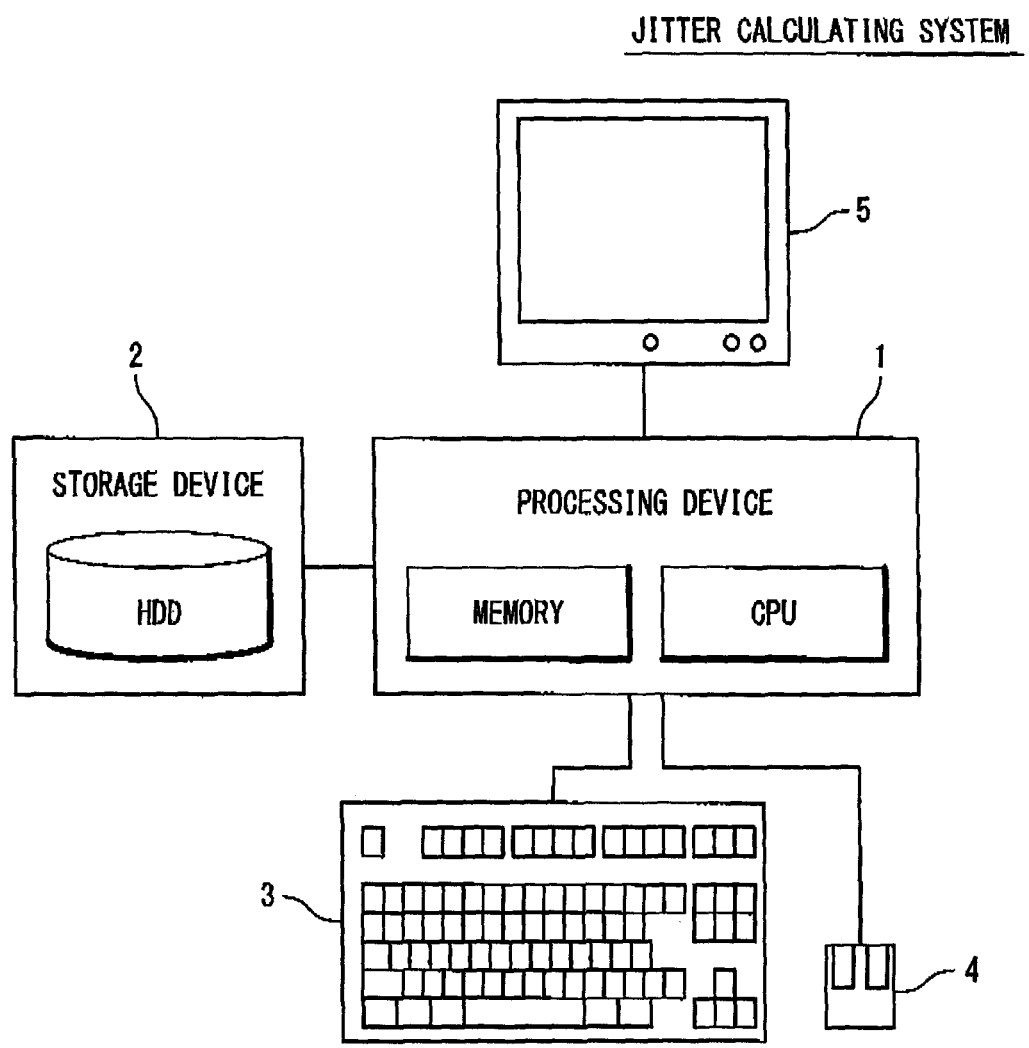
FIG. 1 is a schematic diagram showing a jitter calculating system according to a first embodiment.

FIG. 1 is a schematic diagram showing a jitter calculating system according to a first embodiment. The jitter calculating system contains a processing device (jitter calculating device 1), a storage device 2, a keyboard 3, a mouse 4 and a display device 5. The jitter calculating device 1 is implemented by a computer that contains memories (for example, ROM: Read Only Memory, RAM: Random Access Memory), a CPU (Central Processing Unit) and the like. The keyboard 3 and the mouse 4 are provided to transmit instructions from a user to the jitter calculating device 1. The display device 5 is a CRT (Cathode Ray Tube) display, a LCD (Liquid Crystal Display) or the like. The display device 5 contains a display screen on which notifications and the like to the user from the jitter calculating device 1 are displayed. The storage device 2 is exemplified as a hard disk device and stores information used by the jitter calculating device 1.

The jitter calculating device 1 calculates a clock jitter in an analysis target circuit based on a circuit data indicating the analysis target circuit. In the circuit data, the analysis target circuit is represented by many cells. In the analysis target circuit, a clock signal is generated by a clock source (initial point). The clock signal is supplied from the clock source to a clock supply destination (end point). The jitter calculating device 1 calculates the clock jitter. Here, in the present embodiment, the clock jitter is defined as a value that indicates a deviation of a switching timing of the clock signal (a timing of transition to a different logic level) from an ideal timing.

Figure 2:
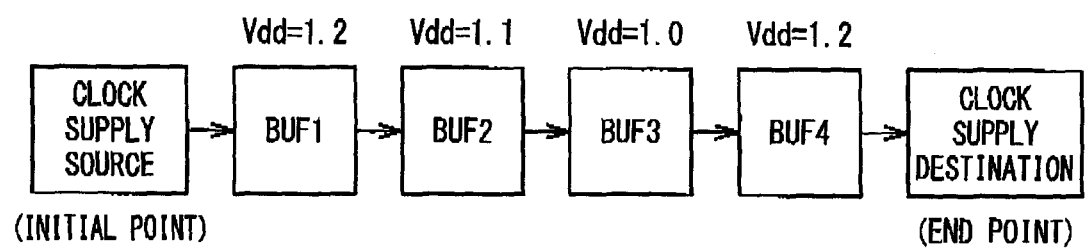
FIG. 2 is a schematic diagram showing one example of a path.

A propagation route of the clock signal is referred to as a path. FIG. 2 is a schematic diagram showing one example of the path. The path shown in FIG. 2 includes four cells (BUFs 1 to 4). That is, the clock signal is supplied from the clock supply source through the BUFs 1 to 4 to the clock supply destination. Power source voltages are supplied through power source wirings (not shown) to the respective cells. The respective cells are driven by the power source voltages. In the example shown in FIG. 2, 1.2, 1.1, 1.0 and 1.2 V are supplied as the power source voltage Vdds to the BUFs 1 to 4, respectively.

Figure 3:
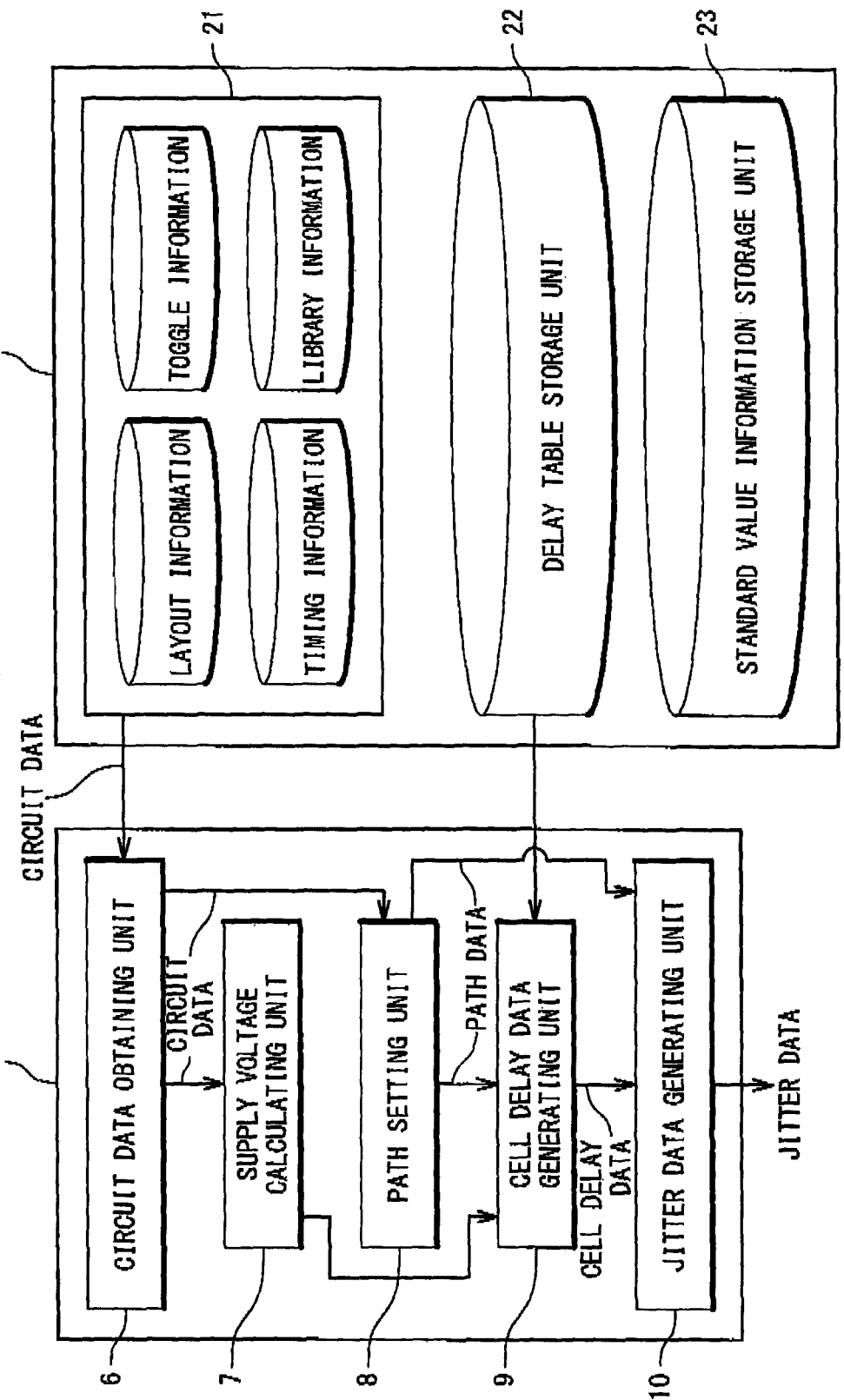
FIG. 3 is a functional block diagram showing a jitter calculating device and a storage device according to the first embodiment.

FIG. 3 is a functional block diagram showing the jitter calculating device 1 and the storage device 2. As shown in FIG. 3, the jitter calculating device 1 is connected to the storage device 2 such that the jitter calculating device 1 can access the storage device 2.

At first, information stored in the storage device 2 is described. The storage device 2 contains a circuit data storage unit 21, a delay table storage unit 22 and a standard value information storage unit 23.

The circuit data storage unit 21 stores the circuit data specifying the circuit as an analysis target. In the circuit data, the analysis target circuit is represented by the many cells.

Specifically, the circuit data storage unit 21 stores layout information, toggle information, timing information, and library information. The layout information indicates connection relation among the cells included in the analysis target circuit, arrangement positions of the respective cells, a topology of the power source wirings, power source wiring widths and the like. The toggle information indicates a toggle rate of the analysis target circuit. The timing information includes a frequency of the clock signal, switching timings of the respective cells, information specifying clock signals for controlling the respective cells, and the like. The library information is used to determine electric current consumptions in the respective cells. The library information includes, for example, information for each cell. The information indicates a correspondence relation among a type of the cell, a level of an input signal supplied to the cell, a transition time of the input signal, a load capability of an output signal outputted by the cell.

Next, the delay table storage unit 22 is described. The delay table storage unit 22 stores a delay table. FIG. 4 is a conceptual diagram showing the delay table. As shown in FIG. 4, the delay table indicates a correspondence relation among an input transition time, a supply voltage, a cell delay time (a cell delay amount) and an output transition time.

Figure 5:
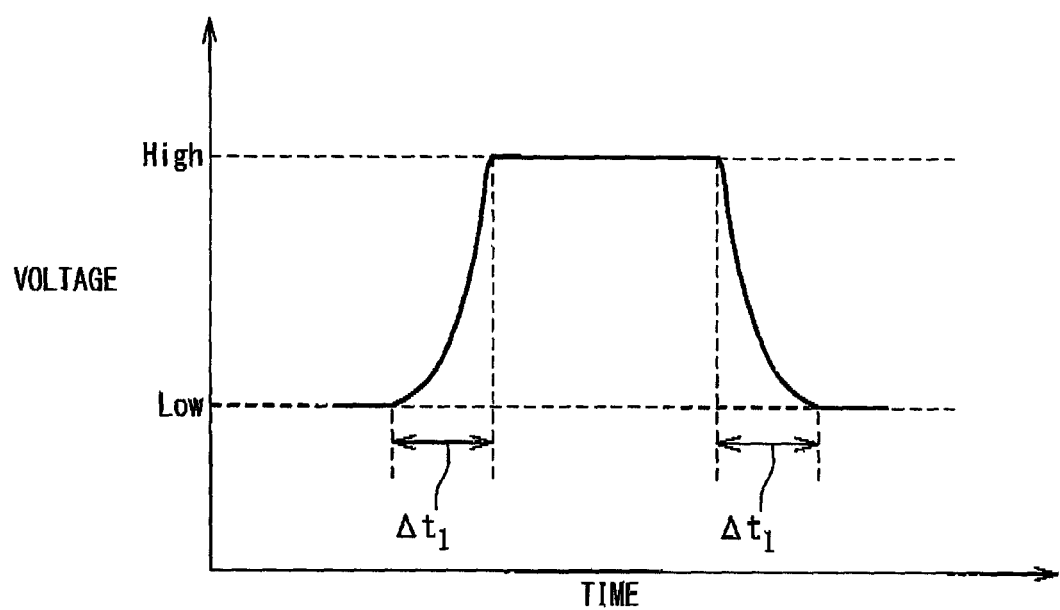
FIG. 5 is a schematic diagram showing one example of a waveform of an input signal.

The input transition time indicates a transition time of clock signal (hereinafter, referred to as input signal) supplied to each cell. FIG. 5 is a schematic diagram showing one example of the waveform of the input signal. In FIG. 5, the horizontal axis indicates time, and the vertical axis indicates voltage of the signal. The signal is assumed to ideally exhibit a rectangular wave. In this case, it is possible to use as the input transition time, for example, a time $\Delta t_1$ required for a transition of voltage of the signal to a different level.

Referring to FIG. 4 again, the supply voltages indicate values of the power source voltages supplied to the respective cells.

The cell delay times are values indicating times required for the clock signal to pass the respective cells.

The output transition time indicates a transition time of clock signal (hereinafter, referred to as output signal) outputted from each cell. The output transition time is also represented, for example, by a time required for a transition of voltage of the signal to a different level, similarly to the input transition time.

The above delay table is prepared in advance by, for example, a circuit simulation, an actual measurement or the like. The delay table is preferred to indicate values with respect to representative cells (cells which are used frequently, cells having delay times of an average level, or the like) included in the analysis target circuit. Alternatively, the delay table may be prepared for each type of cell.

Next, a configuration of the jitter calculating device 1 is specifically described. As shown in FIG. 3, the jitter calculating device 1 contains a circuit data obtaining unit 6, a supply voltage calculating unit 7, a path setting unit 8, a cell delay data generating unit 9 and a jitter data generating unit 10. They are implemented by the CPU which executes a jitter calculating program stored in a storage medium such as the ROM. The storage medium may be a non-transitory tangible medium.

The circuit data obtaining unit 6 obtains the circuit data from the circuit data storage unit 21.

The supply voltage calculating unit 7 calculates power source voltages, which are supplied to the respective cells included in the analysis target circuit, as supply voltages based on the circuit data. The supply voltage calculating unit 7 generates a supply voltage data that indicates the supply voltages to the respective cells.

The path setting unit 8 sets a path for which the clock jitter is calculated, as an analysis target path. The path betting unit 8 generates a path data indicating the analysis target path.

The cell delay data generating unit 9 determines a cell delay amount indicating how long a delay time of the signal is based on the path data and the supply voltage data. In the present embodiment, the cell delay time itself is determined as the cell delay amount. The cell delay time is determined for each cell included in the analysis target path. The cell delay data generating unit 9 refers to the delay table storage unit 22 to determine the cell delay times. The cell delay data generating unit 9 generates a cell delay data indicating the cell delay times of the respective cells.

The jitter data generating unit 10 calculates cell delay time variation amounts based on the cell delay data. The cell delay time variation amounts are values indicating deviations of the cell delay times of the respective cells from predetermined standard values. Here, separately-prepared values are used as the standard values. For example, the jitter data generating unit 10 obtains an input transition time serving as a standard (a standard input transition time) and a supply voltage serving as a standard (a standard supply voltage). Then, the jitter data generating unit 10 refers to the delay table to obtain a cell delay time, which corresponds to the obtained standard input transition time and standard supply voltage, as a standard value. The standard input transition time and the standard supply voltage are given, for example, by the user inputting them to the computer through the keyboard or the like. The predetermined standard values may be stored in the standard value information storage unit 23. Moreover, the jitter data generating unit 10 calculates a deviation of a final supply timing of the clock signal (a timing at which the clock signal is supplied to the clock supply destination) from an ideal timing based on the cell delay time variation amounts, and outputs the deviation as a jitter data indicating the clock jitter. The jitter data may be stored in the storage device 2 or another tangible recording medium. Here, the ideal timing is, for example, a timing in a case that the cell delay times coincide with the standard values in all the cells included in the analysis target path.

Figure 6:
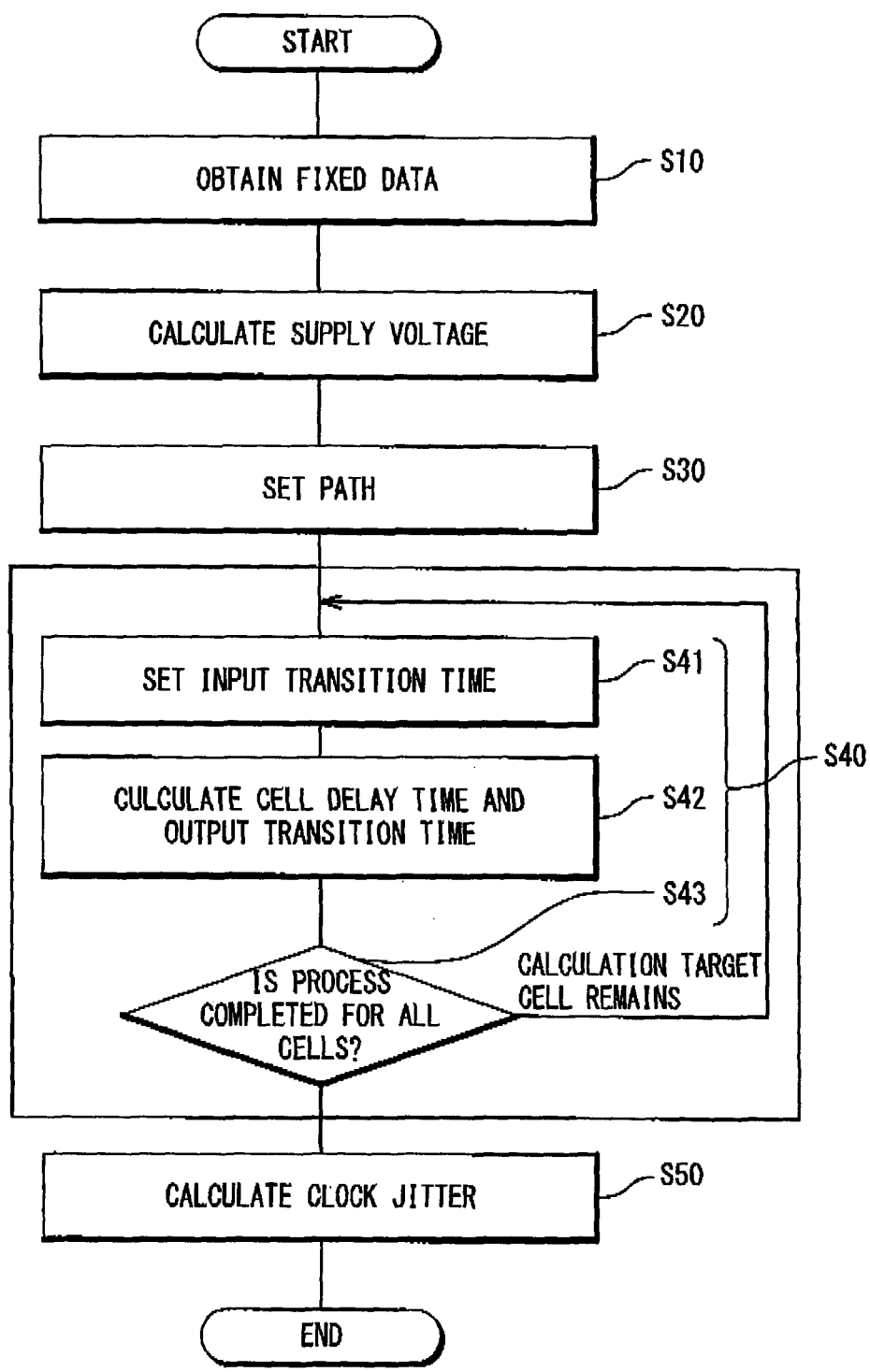
FIG. 6 is a flowchart showing an operating method of the jitter calculating device.

Next, an operating method of the jitter calculating device 1 according to the present embodiment is described. FIG. 6 is a flowchart showing the operating method of the jitter calculating device 1.

Step S10: Obtain Circuit Data

At first, the circuit data obtaining unit 6 obtains the circuit data as a fixed data from the circuit data storage unit 21.

Step S20: Calculate Supply Voltage

Next, the supply voltage calculating unit 7 calculates based on the circuit data, the power source voltages supplied to the respective cells as supply voltages. The supply voltage calculating unit 7 generates the supply voltage data indicating the supply voltage for each cell. In the example shown in FIG. 2, 1.2 V is calculated as a supply voltage to the cell (BUF 1), 1.1 V is calculated as a supply voltage to the cell (BUF 2), 1.0 V is calculated as a supply voltage to the cell (BUF 3), and 1.2 V is calculated as a supply voltage to the cell (BUF 4).

Step S30: Set Path

Next, the path setting unit 8 determines the analysis target path based on the circuit data. The path setting unit 8 generates the path data indicating the analysis target path.

Step S40: Generate Cell Delay Data

Next, the cell delay data generating unit 9 determines the cell delay times in the respective cells included in the analysis target path by performing processes of the following steps S41 to S43. Here, as described below, the cell delay times are determined in the order of the cells, namely, a cell delay time in a first stage cell (a cell to which the clock signal is supplied at first) is determined at first.

(Step S41: Set Input Transition Time)

The cell delay data generating unit 9 sets an input transition time with respect to a cell for which a cell delay time is calculated (a calculation target cell, a lower stage cell). As the input transition time, an output transition time for a cell arranged in an upper stage of the calculation target cell (an upper stage cell) is used. Here, when the calculation target cell is the first stage cell, a predetermined initial value is used as the input transition time.

(Step S42: Calculate Cell Delay Time and Output Transition Time)

Next, the cell delay data generating unit 9 determines a cell delay time and an output transition time for the calculation target cell based on the supply voltage data and the input transition time. The cell delay data generating unit 9 determines the cell delay time and the output transition time by referring to the delay table to obtain values corresponding to the supply voltage and the input transition time. The calculated output transition time is used to calculate a cell delay time in a cell arranged in the next stage.

(Step S43: Is Calculation Completed for All Cells?)

Next, the cell delay data generating unit 9 judges whether or not the cell delay time is determined for all the cells included in the analysis target path. When the cell delay time has been determined for all the cells, the cell delay data indicating the delay times in the respective cells is generated, and a process of a next step S50 is executed. On the other hand, when there is a cell for which a cell delay time has not been determined, a cell in the next stage is set to be the calculation target cell, and the processes of the step S41 and the following steps are repeated.

A specific example of the process of the step S40 will be described below with reference to FIG. 7. FIG. 7 is an explanatory drawing illustrating the operation of the cell delay data generating unit 9. Here, the path shown in FIG. 2 is given as the analysis target path.

At first, for the first stage cell (BUF 1), a predetermined initial value of 1.0 ns is given as an input transition time. A value of 1.2V is determined as a supply voltage supplied to the BUF 1 based on the supply voltage data. The cell delay data generating unit 9 refers to the delay table to determine a cell delay time and an output transition time corresponding to the input transition time (1.0 ns) and the supply voltage (1.2V). In a case that the table shown in FIG. 4 is prepared as the delay table, a value of 1.0 ps is obtained as the cell delay time for the BUF 1, and a value of 1.0 ns is obtained as the output transition time for the BUF 1.

Next, the cell delay data generating unit 9 determines a cell delay time and an output transition time for the cell (BUF 2) in the second stage. Here, the output transition time for the BUF 1 is used as an input transition time for the BUF 2. That is, a value of 1.0 ns is set as the input transition time. Moreover, based on the supply voltage data, a value of 1.1V is obtained as a supply voltage supplied to the BUF 2. The cell delay data generating unit 9 determines the cell delay time (1.1 ps) and the output transition time (1.3 ns) based on the input transition time and the supply voltage.

Hereafter, similarly to the above description, the cell delay time and the output transition time are determined for all of the cells (BUFs 1 to 4). The point that the waveform of the clock signal changes at every passing the cell is reflected on the cell delay times determined as described above. Also, the point that the transition time depends on the supply voltage is reflected on the cell delay times. That is, the cell delay times for the respective cells are determined at a high precision.

Step S50: Calculate Clock Jitter

Next, the jitter data generating unit 10 calculates a clock jitter based on the cell delay data generated at the step S40. Here, the jitter data generating unit 10 refers to the standard value information storage unit 23 to calculate the clock jitter. Then, the jitter data generating unit 10 generates and outputs the jitter data indicating the clock jitter. Specifically, the jitter data generating unit 10 determines the cell delay time variation amounts for the respective cells. As mentioned above, the cell delay time variation amount indicates the difference between the cell delay time and the predetermined standard value. Then, the sum of the cell delay time variation amounts is calculated with respect to the plurality of cells included in the analysis target path. The calculation result is outputted as the clock jitter.

The cell delay time variation amount is determined by subtracting the standard value from the cell delay time. It is assumed that data shown in FIG. 7 is given as the cell delay data. It is assumed that a value of 1.0 ps is set as the standard value of the cell delay time in a case that the input transition time is 1.0 ns and the supply voltage is 1.2V. In this case, for the BUF 1, since the cell delay time is 1.0 ps, the cell delay time variation amount is 0 ps. On the other hand, for the BUF 2, the cell delay time is 1.1 ps. Thus, by subtracting the standard value of 1.0 ps from the cell delay time of 1.1 ps, a value of 0.1 ps is obtained as the cell delay time variation amount Similarly, a value of 0.3 ps is determined as the cell delay time variation amount for the BUF 3, and a value of 0.3 ps is determined as the cell delay time variation amount of the BUF 4. By calculating the sum of the cell delay time variation amounts (0+0.1+0.3+0.3=0.7), a value of 0.7 ps is determined as the clock jitter.

As mentioned above, according to the present embodiment, the point that the transition time of the input signal has an influence on the cell delay time in each cell, the point that the transition time of the input signal changes at every passing the cell, and the point that the transition time changes depending on the supply voltage are reflected on the cell delay time. Thus, the cell delay time can be estimated at a high precision. Hence, the clock jitter can be calculated at a high precision.

An example is described, in which the cell delay time is determined without considering the transition time, to be compared with the present embodiment. FIG. 8 is a conceptual drawing showing cell delay times obtained in the comparison example. It is assumed that the path shown in FIG. 2 is given as the analysis target path. In the case of this example, as the cell delay time in the BUF 1, a value of 1.0 ps is calculated based on the supply voltage of 1.2 V. As the cell delay time in the BUF 2, a value of 1.1 ps is calculated based on the supply voltage of 1.1 V. As the cell delay time in the BUF 3, a value of 1.2 ps is calculated based on the supply voltage of 1.0 V. As the cell delay time in the BUF 4, a value of 1.0 ps is calculated based on the supply voltage of 1.2 V. In this way, in the comparison example, the cell delay times in the respective cells are different from the values in the present embodiment. That is, in the comparison example, the input transition time and the point that the input transition time changes at every passing the cell are not reflected on the cell delay time. Thus, as compared with the present embodiment, it is difficult to estimate the clock jitter at a high precision.

The present embodiment is described about the case in which the analysis target path is a path of the clock signal. That is, the jitter data generating unit 10 according to the present embodiment calculates the clock jitter as a jitter. However, the analysis target path is not always required to be the path of the clock signal. The jitter calculating device 1 according to the present embodiment may be configured to calculate a jitter value with respect to a signal other than the clock signal.

Also, the present embodiment is described about the case in which for each cell, the cell delay time is determined as the cell delay amount. However, the cell delay time itself is not always required to be used as the cell delay amount. Any other parameter on which the cell delay time is reflected can be used as the cell delay amount. For example, as the cell delay amount, a parameter (a cell delay value) represented by a result of dividing the cell delay time with the standard value can be used. In this case, the cell delay value is stored in the delay table in place of the cell delay time.

In the present embodiment, the jitter data generating unit 10 calculates the clock jitter by summing the cell delay time variation amounts. However, another method may be used as a calculating method of the clock jitter. For example, the clock jitter can be determined as a square root of sum of squares of the cell delay time variation amounts.

Second Embodiment

A second embodiment will be described below. The transition time of the clock signal may be different between at a rise (a transition from a low level to a high level) and at a fall (a transition from the high level to the low level). The transition time at the rise may be different from the transition time at the fall in characteristic. That is, an influence of the transition time at the rise on the delay time and the like may be different from an influence of the transition time at the fall on the delay time and the like. Therefore, in the present embodiment, as the transition time, the transition time at the rise and the transition time at the fall are respectively given. Then, the cell delay time at the rise and the cell delay time at the fall are respectively determined. Moreover, a clock jitter at the rise and a clock jitter at the fall are respectively determined. Accordingly, the clock jitter at the rise and the clock jitter at the fall can be quantitatively separated, and the clock jitter can be estimated at a higher precision.

Figure 9:
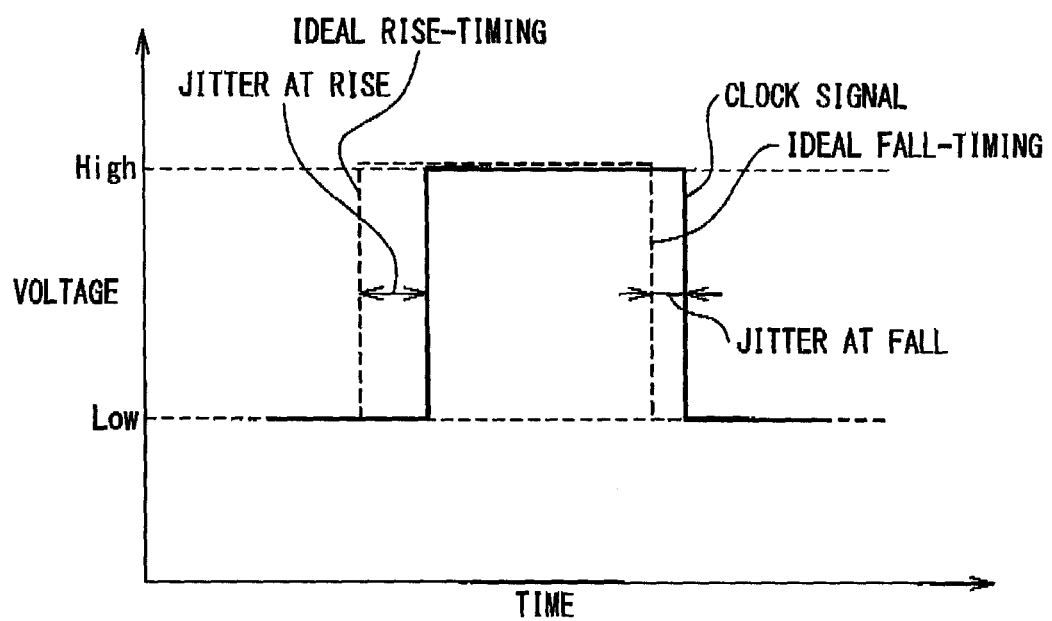
FIG. 9 is an explanatory drawing illustrating a clock jitter determined according to a second embodiment.

FIG. 9 is an explanatory drawing illustrating clock jitters determined in the present embodiment. In FIG. 9, the horizontal axis indicates time, and the vertical axis indicates voltage. As shown in FIG. 9, a deviation between a timing at which the clock signal is shifted from a low level to a high level and an ideal rise-timing is determined as the clock jitter at the rise. Also, a deviation between a timing at which the clock signal is shifted from the high level to the low level and an ideal fall-timing is determined as the clock jitter at the fall. The other points can be same as those of the first embodiment, and detailed descriptions for the other points are omitted.

Figure 10:
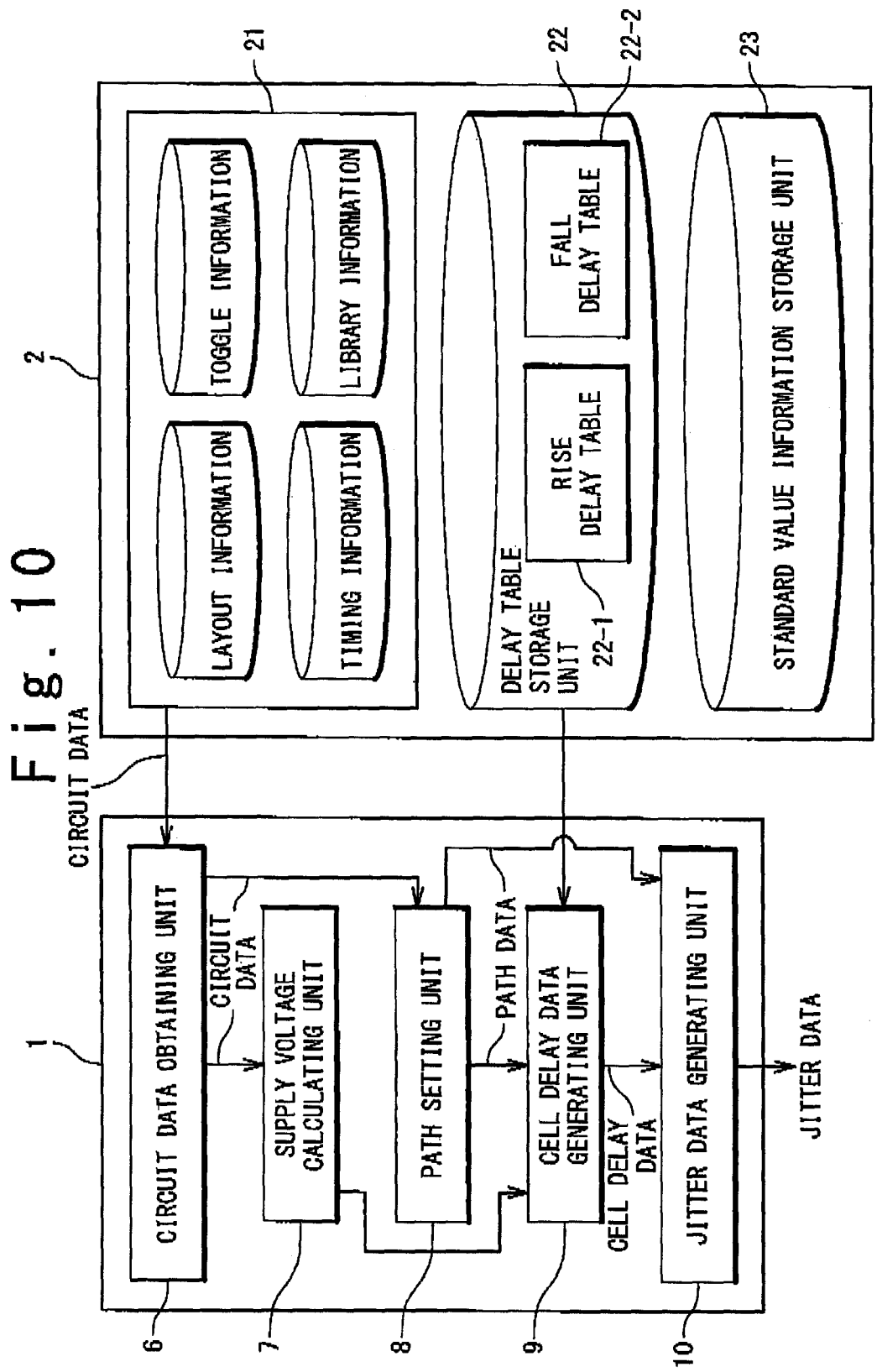
FIG. 10 is a functional block diagram showing a jitter calculating device and a storage device according to the second embodiment.
Figure 11:
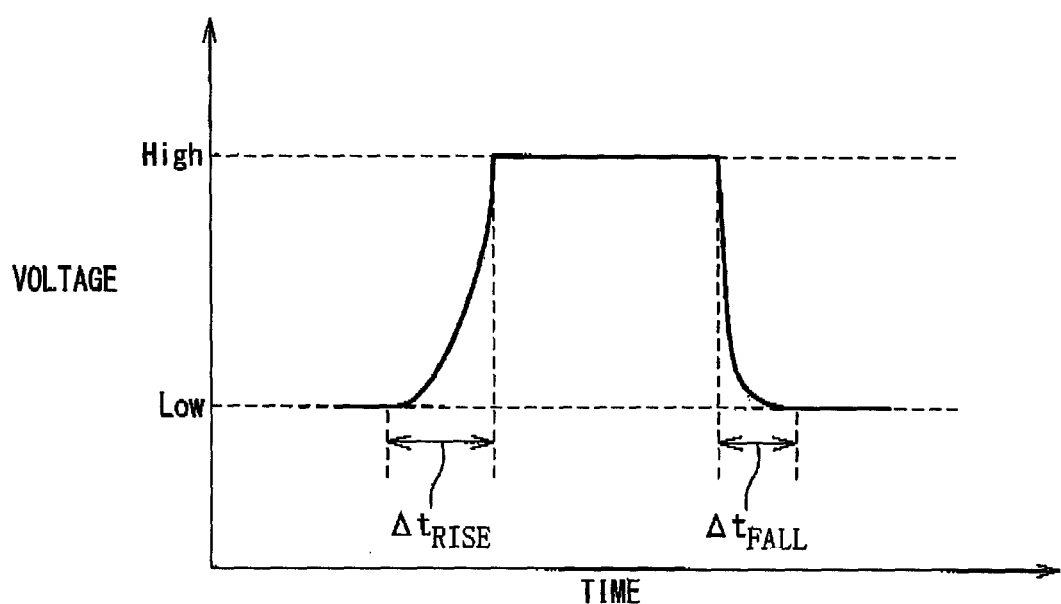
FIG. 11 shows one example of a clock signal supplied to each cell.

FIG. 10 is a functional block diagram showing the jitter calculating device 1 and the storage device 2. In this embodiment, the delay table storage unit 22 stores a rise delay table 22-1 and a fall delay table 22-2. The rise delay table 22-1 describes, with respect to the rise, a correspondence relation among the input transition time, the supply voltage, the cell delay time and the output transition time. The fall delay table 22-2 describes, with respect to the fall, a correspondence relation among the input transition time, the supply voltage, the cell delay time and the output transition time. FIG. 11 shows one example of the clock signal supplied to each cell. In FIG. 11, the horizontal axis indicates time, and the vertical axis indicates voltage. In the rise delay table 22-1, a transition time $\Delta t_{RISE}$ at the transition from the low level to the high level is used as the input transition time. In the fall delay table 22-2, a transition time $\Delta t_{FALL}$ at the transition from the high level to the low level is used as the input transition time.

In the present embodiment, the cell delay data generating unit 9 determines an output transition time for the cell in the upper stage, for each of the rise and the fall. Thus, rise transition time data and fall transition time data are generated. Then, based on the rise transition time data and the fall transition time data, a cell delay time in the lower stage cell is determined for each of the rise and the fall. Similarly, an output transition time for the lower stage cell is determined for each of the rise and the fall. That is, the cell delay time in each cell is determined for each of the rise and the fall. Then, the jitter data generating unit 10 determines the clock jitter for each of the rise and the fall. Here, when the cell includes an inverting circuit such as an inverter, the waveform of the input signal at the rise corresponds to the waveform of the output signal at the fall and the waveform of the input signal at the fall corresponds to the waveform of the output signal at the rise. Therefore, when the upper stage cell includes the inverting circuit, the cell delay data generating unit 9 changes the delay table (the rise delay table or the fall delay table) to be referred in the calculation of the cell delay time and the output transition time for the lower stage cell. For example, it is supposed that the cell delay time and the output transition time are determined for each of the cells in the first stage to the upper stage by using the rise delay table and that the upper stage cell includes the inverting circuit. In this case, the cell delay time and the output transition time for the lower stage cell are determined by using the fall delay table. Through such operation, even when the clock signal passes through the inverting circuit, the clock jitter at the rise and the clock jitter at the fall can be accurately estimated.

According to the present embodiment, the clock jitter is determined at a high precision for each of the rise and the fall. Therefore, the clock jitter can be verified at a high precision.

As mentioned above, the present invention has been described by referring to the first and second embodiments. It should be noted that those embodiments are not independent of each other, and that they can be combined without causing any confliction.

What is claimed is:

1. A jitter calculating method performed by a processing device executing software code configured to cause the processing device to perform one or more operations of the method, the method comprising:

obtaining circuit data indicating a circuit from a storage device;

setting a path of a signal, which extends from an initial point through a plurality of cells to an end point, to be an analysis target path based on said circuit data;

calculating power supply voltages respectively supplied to said plurality of cells as supply voltages based on said circuit data;

generating cell delay data by calculating cell delay amounts indicating how long delay times of said signal are in each of said plurality of cells; and calculating jitter values in said end point based on said cell delay data, wherein said plurality of cells include:

an upper stage cell; and a lower stage cell connected to a lower stage of said upper stage cell, said supply voltages include:

a first supply voltage supplied to said upper stage cell; and a second supply voltage supplied to said lower stage cell, said signal is supplied as a first input signal to said upper stage cell, said signal is outputted as a first output signal from said upper stage cell, said signal is supplied as a second input signal to said lower stage cell, said signal is outputted as a second output signal from said lower stage cell, and said generating said cell delay data includes:

calculating, based on a first input transition time as a transition time of said first input signal and said first supply voltage, first cell delay amounts indicating delay times
of said signal in said upper stage cell and a first output
transition time as a transition time of said first output
signal;

setting said first output transition time to be a second input
transition time as a transition time of said second input
signal; and calculating, based on said second input transition time and
said second supply voltage, second cell delay amounts
indicating delay times of said signal in said lower stage
cell and a second output transition time as a transition
time of said second output signal.

2. The jitter calculating method according to claim 1, wherein said signal is a clock signal.

3. The jitter calculating method according to claim 1, wherein said first cell delay amounts include:
a first rise cell delay amount corresponding to a rise of said signal; and
a first fall cell delay amount corresponding to a fall of said signal,
said second cell delay amounts include:
a second rise cell delay amount corresponding to a rise of said signal; and
a second fall cell delay amount corresponding to a fall of said signal, and
said jitter values include:
a rise jitter value corresponding to a rise of said signal; and
a fall jitter value corresponding to a fall of said signal.

4. The jitter calculating method according to claim 1, wherein the operation of calculating jitter values based on said cell delay data comprises determining cell delay time variation amounts for the cells based on a difference between the calculated cell delay amount in each of the cells and a predetermined standard cell delay amount.

5. A computer-readable recording medium as a non-transitory tangible medium, storing a jitter calculating program for causing a computer to perform a jitter calculating method comprising:
obtaining a circuit data indicating a circuit;
setting a path of a signal, which extends from an initial point through a plurality of cells to an end point, to be an analysis target path based on said circuit data;
calculating power supply voltages respectively supplied to said plurality of cells as supply voltages based on said circuit data;
generating a cell delay data by calculating cell delay amounts indicating how long delay times of said signal are in each of said plurality of cells; and
calculating jitter values in said end point based on said cell delay data,
wherein said plurality of cells include:
an upper stage cell; and
a lower stage cell connected to a lower stage of said upper stage cell,
said supply voltages include:
a first supply voltage supplied to said upper stage cell; and
a second supply voltage supplied to said lower stage cell,
said signal is supplied as a first input signal to said upper stage cell,
said signal is outputted as a first output signal from said upper stage cell,
said signal is supplied as a second input signal to said lower stage cell,
said signal is outputted as a second output signal from said lower stage cell, and
said generating said cell delay data includes:

calculating, based on a first input transition time as a transition time of said first input signal and said first supply voltage, first cell delay amounts indicating delay times of said signal in said upper stage cell and a first output transition time as a transition time of said first output signal;
setting said first output transition time to be a second input transition time as a transition time of said second input signal; and
calculating, based on said second input transition time and said second supply voltage, second cell delay amounts indicating delay times of said signal in said lower stage cell and a second output transition time as a transition time of said second output signal.

6. A jitter calculating device comprising:
a circuit data obtaining unit configured to obtain a circuit data indicating a circuit;
a path setting unit configured to set a path of a signal, which extends from ah initial point through a plurality of cells to an end point, to be an analysis target path based on said circuit data;
a supply voltage calculating unit configured to calculate power supply voltages respectively supplied to said plurality of cells as supply voltages based on said circuit data;
a cell delay data generating unit configured to generate a cell delay data by calculating cell delay amounts indicating how long delay times of said signal are in each of said plurality of cells; and
a jitter data generating unit configured to calculate jitter values in said end point based on said cell delay data,
wherein said plurality of cells include:
an upper stage cell; and
a lower stage cell connected to a lower stage of said upper stage cell,
said supply voltages include:
a first supply voltage supplied to said upper stage cell; and
a second supply voltage supplied to said lower stage cell,
said signal is supplied as a first input signal to said upper stage cell,
said signal is outputted as a first output signal from said upper stage cell,
said signal is supplied as a second input signal to said lower stage cell,
said signal is outputted as a second output signal from said lower stage cell, and
said cell delay data generating unit calculates, based on a first input transition time as a transition time of said first input signal and said first supply voltage, first cell delay amounts indicating delay times of said signal in said upper stage cell and a first output transition time as a transition time of said first output signal,
said cell delay data generating unit sets said first output transition time to be a second input transition time as a transition time of said second input signal, and
said cell delay data generating unit calculates, based on said second input transition time and said second supply voltage, second cell delay amounts indicating delay times of said signal in said lower stage cell and a second output transition time as a transition time of said second output signal.

7. The jitter calculating device according to claim 6, wherein said signal is a clock signal.

8. The jitter calculating device according to claim 6, wherein said first cell delay amounts include:
a first rise cell delay amount corresponding to a rise of said signal; and a first fall cell delay amount corresponding to a fall of said signal, said second cell delay amounts include:

a second rise cell delay amount corresponding to a rise of said signal; and a second fall cell delay amount corresponding to a fall of said signal, and said jitter values include:

a rise jitter value corresponding to a rise of said signal; and a fall jitter value corresponding to a fall of said signal.

9. The jitter calculating device according to claim 6, wherein the jitter data generating unit calculates jitter values based on the cell delay data by determining cell delay time variation amounts for the cells based on a difference between the calculated cell delay amount in each of the cells and a predetermined standard cell delay amount.

* * * * *